United States Patent [19]

Dennard et al.

[11] 3,899,363

[45] Aug. 12, 1975

[54] METHOD AND DEVICE FOR REDUCING SIDEWALL CONDUCTION IN RECESSED OXIDE PET ARRAYS

[75] Inventors: Robert H. Dennard, Croton-on-Hudson; Vincent L. Rideout, Mohegan Lake; Edward J. Walker, Ossining, all of N.Y.

[73] Assignee: International Business Machines Corporation, Armonk, N.Y.

[22] Filed: June 28, 1974

[21] Appl. No.: 484,033

[52] U.S. Cl. .................... 148/1.5; 148/187; 156/17; 357/15; 357/22

[51] Int. Cl. .................... H01l 9/54

[58] Field of Search ....... 148/1.5, 175, 187; 156/17; 357/15, 22

[56] References Cited

UNITED STATES PATENTS

| | | | |
|---|---|---|---|
| 3,550,260 | 12/1970 | Saltich et al. | 148/175 UX |
| 3,550,292 | 12/1970 | Irie et al. | 148/1.5 |
| 3,615,875 | 10/1971 | Morita et al. | 148/1.5 |
| 3,659,160 | 4/1972 | Sloan, Jr. | 148/175 X |
| 3,730,778 | 5/1973 | Shannon et al. | 148/1.5 |
| 3,742,317 | 6/1973 | Shao | 148/175 UX |

OTHER PUBLICATIONS

Magdo et al., "Dielectrically Isolated Transistor," IBM Tech. Disc. Bull., Vol. 13, No. 11, Apr. 1971, p. 3238.

Lee, "Anisotropic Etching of Silicon," J. Appl. Phys. Vol. 40, No. 11, Oct. 1969, pp. 4569–4574.

*Primary Examiner*—C. Lovell
*Assistant Examiner*—J. M. Davis
*Attorney, Agent, or Firm*—Hansel L. McGee

[57] ABSTRACT

Densely packed integrated circuit arrays for high speed memory and logic applications are fabricated using silicon semiconductor field-effect transistors (FET) which are electrically isolated one from the other by fully recessed oxide isolation regions. The method of fabrication is featured by the reduction of detrimental source to drain conduction along the sidewall of the recessed oxide to a level less than that of the main channel of the FET. Ion implantation is used to provide additional doping concentrations in the silicon substrate adjacent to the sidewall region and underneath the recessed oxide. The excess dopant underneath the recessed oxide serves as a parasitic-channel stopper. Sidewall doping is facilitated by implanting into canted sidewalls in the silicon substrate prior to the formation of the recessed oxide therein. The canted side-walls are achieved by utilizing an anisotropic etch in combination with a <100> oriented p-conductivity type substrate.

6 Claims, 10 Drawing Figures

METHOD AND DEVICE FOR REDUCING SIDEWALL CONDUCTION IN RECESSED OXIDE PET ARRAYS

BACKGROUND OF THE INVENTION

1. Field of the Invention

This invention relates generally to arrays of recessed oxide FETs. More specifically, it relates to arrays of n-channel recessed oxide FETs which are of minimum dimensions and which are formed in a p-conductivity type silicon substrate having a <100> orientation. Still more specifically, it relates to an array of n-channel FET one-device memory cells which employ fully recessed thermal oxide regions beneath which is an ion implanted channel stopper that reduces leakage from device to device and the method of fabrication therefor. Yet more specifically it relates to the above-mentioned FETs, isolated by recessed oxide regions, having p-type dopant ions implanted along the vertical sidewalls of the recessed oxide and extending up to the silicon surface, and the method of fabrication therefor. This extra sidewall dopant, which is ion implanted as the same time as the channel stopper implantation, raises the threshold of and decreases the conduction along the sides of the main channel of the FET. This permits the formation of extremely small FETs of minimum dimension which have extremely low source to drain leakage current values. The resulting low leakage substantially reduces the refresh requirements which in turn reduces the overall power consumption of an n-channel FET one-device memory cell array. Reduction of source to drain sidewall currents in n-channel FETs allows high switching speed device arrays with higher densities and lower power consumption to be fabricated.

2. Description of the Prior Art

Arrays of FETs utilizing fully recessed thermal oixde are known in the prior art. These arrays, however, involve p-channel FETs formed in an n-conductivity type substrate. In the known prior art, an isotropic etchant is utilized such that the etched out region which is to contain the recessed oxide undercuts overlying etch-masking layers. As a consequence of the isotropic etching approach, the etched out region is partially masked by the overlying etch-masking layers so that the subsequent ion implantation step provides an ion implanted region which only extends partially across the bottom of the etched out region. Arrays of p-channel FETs, however, are not subject to sidewall conduction problems as are arrays utilizing n-channel devices because, in the former, the thermal oxidation step which forms the recessed oxide causes a piling up or snow plowing of the n-type dopant such as phosphorus in the silicon substrate in the vicinity of the interface between the recessed oxide and the substrate. Thus, for fully recessed oxide p-channel FETs, the threshold (gate threshold voltage) in the interface regions along the sides of the main channel region is naturally enhanced, and thus this sidewall threshold is naturally higher than that of the main channel region.

Because the mobility of electrons in silicon is much greater than that of holes, n-channel FETs have an inherent switching speed advantage over p-channel FETs. In order to fabricate very densely packed arrays of FETs, as in an integrated circuit memory of logic chip, it is preferable to recess the isolation oxide within the substrate and level with the silicon surface rather than allow it to protrude above the surface as was commonly done in the past. Recessed oxide isolation leads to reduced capacitance of diffused regions and a more planar surface which increases the resolution capability of photoresist exposure patterns as well as the reliability of metalization patterns. All factors being equal, the n-channel device would be preferred for high density arrays because of its inherent speed advantage. Unfortunately, n-channel FETs (which use p-conductivity type substrates) exhibit a processing difficulty when fabricated using recessed thermal oxide, namely that the p-type dopant such as boron in the substrate is depleted from the substrate at the oxide-substrate interface during oxide growth. For recessed oxide n-channel FETs used in intergrated circuits where low source to drain currents are required when the switching device is in its "off" state, the naturally occurring depletion of dopant from the silicon must be artificically replenished by diffusion or ion implantation. Ion implantation is preferred over diffusion as a means for supplying the excess p-type dopant because the dopant profile can be more accurately defined and because the peak of the profile can be placed beneath the surface and at a depth slightly greater than that of the subsequent oxide-silicon interface. A much higher level and spatially less well-defined dopant profile occurs if diffusion doping techniques are utilized. Furthermore, the greater lateral extent of diffused regions may adversely reduce the reverse bias breakdown voltage of n-type source and drain regions. This is not the case when ion implantation is utilized.

For p-channel devices, however, the naturally occurring accumulation of n-type dopant under the recessed oxide prevents the formation of parasitic conduction channels beneath the recessed oxide that would otherwise electrically connect adjacent FETs, while accumulation along the sidewall of the recessed oxide insures that source to drain currents in any FET will be reduced. U.S. Pat. No. 3,748,187 in the name of K. G. Aubuchon et al. issued July 24, 1973, and entitled "Self-Registered Doped Layer for Preventing Field Inversion in MIS Circuits" is representative of the prior ion implanted art wherein sidewall conduction is naturally compensated for and does not require the extension of the ion implanted channel stopper up to the silicon surface where it intersects the main channel. In the patent, the etched out region which is to contain the recessed oxide has vertical sidewalls and an ion implanted channel stopper at the bottom thereof which extends only partially across the bottom of the etched out region. In fact, the reference specifically avoids the extension of the channel stopper in any way which might cause it to intersect the source, drain, or channel regions of the FET for which it provides isolation. During the fabrication of n-channel field effect transistors, p-type dopants such as boron are depleted from the substrate in the vicinity of the substrate-oxide interface during a thermal oxide growth step. This well known boron depletion phenomenon causes two effects that are detrimental to the device's operation. First, dopant depletion beneath the recessed oxide allows adjacent devices to be electrically connected via a conduction path, i.e., a parasitic channel under the oxide. Second, depletion along the sidewalls of the recessed oxide enhances conduction between the source and drain of any field effect transistor in the array causing it to turn on prematurely. This early turn on, which is also called enhanced subthreshold conduction, is particularly detrimental to dynamic one-device memory cell arrays.

The publication entitled Selective Oxidation of Silicon and Its Device Applications, by G. Kooi and J. A. Appels, published in Semiconductor Silicon, 1973, by The Electrochemical Society, sets forth several methods of preparing semiconductor devices having both partially and fully recessed oxide regions. The publication suggests that isotropic etchants be used to etch out the regions in which the recessed oxide is to be deposited. As indicated above the etchant undercuts the nitride mask. Etching is then followed by diffusion of a p-type dopant to form channel stoppers at the base of the recessed oxide regions, especially in MOS integrated circuits. It is noted that the publication suggests that doping may be done by ion-implantation. If ion-implantation is used for doping in these methods, the sidewalls of the cavities formed by the undercutting etchant cannot be doped to desired levels, because the sidewalls are inaccessible, due to the overhang of the nitride mask and whatever other mask is used in ion-implantation.

The methods disclosed in the publication have the further serious drawback in that the isolation regions, i.e. the recessed oxide and dopant regions, are not well defined and tend to be spread out; therefore, more space between device components will be required. In order to obtain the highest possible packing densities of active devices such as FETs, i.e., prepare many small devices in as small an area as possible, isolation regions must be as small as possible.

The use of anisotropic etchants and doping sidewalls of the depressions by diffusion made thereby is known as illustrated in the U.S. Pat. No. 3,742,317, To Tzu Fann Shao. Here, the technique is used in the preparation of Schottky barrier diodes, devices which characteristically operate in a manner different from the devices of the present invention. For example, current flow in Schottky diodes is downward or perpendicular into the body of the device, while current flow in the devices of the present invention is along the surface (horizontal) of the device. Thus, the problems encountered in the present device are not the same as those in the Schottky devices. Furthermore, the Schottky barrier structure of Shao does not utilize electrical isolation by recessed oxide, but rather by a recessed p-n junction.

The avoidance of the problems encountered in prior art recessed oxide devices is attained by the utilization of the novel method of this invention, wherein an anisotropic etchant is used to prevent undercutting of the nitride oxidation mask and to provide exposed canted silicon sidewalls to implant into, the ion implanted channel stopper is extended to the silicon surface to include both the sidewalls and the total bottom of the etched out region which is to contain the recessed oxide. In this manner the resulting FET array has ion implanted regions in at least the interface regions between the channel region and the recessed oxide with a high threshold which leads to the reduction of the parallel sidewall conduction.

SUMMARY OF THE INVENTION

The present invention generally relates to a semiconductor device having reduced sidewall leakage comprising a semiconductor substrate having at least a single FET formed therein which has source, drain, and channel regions. A recessed oxide region surrounds the FET and forms at least a single interface with the channel region. At least a region of dopant extends from the single interface partly into the main channel region to increase the threshold of the channel region in the region of the dopant. In accordance with another aspect of the present invention, the substrate and the channel region are of p-conductivity type and the source and drain are of n-conductivity type. In accordance with still another aspect of the present invention, the region of dopant is of p-conductivity type and has a concentration of at least equal to the dopant concentration in said substrate. In accordance with yet another aspect of the present invention, the silicon substrate has a <100> crystal orientation.

In accordance with the broadest aspect of the present invention, a method for reducing the subthreshold sidewall conduction between source and drain of an FET which is surrounded by recessed oxide comprises the step of doping by ion implantation at least the channel region of said FET at the interface of said channel region with said surrounding recessed oxide to increase the threshold at the edges of said channel region in the vicinity of said recessed oxide. In accordance with broader aspects of the present invention, the step of doping includes the step of ion implanting a dopant, in at least the channel region of said FET at the interface of said channel region with said surrounding recessed oxide. In accordance with still another aspect of the present invention, the step of ion implanting includes the step of masking said substrate and anisotropically etching said substrate to form a recess in said substrate that does not undercut said mask and that yields canted sidewalls.

In accordance with still more particular aspects of the present invention, the substrate for the FET is p-conductivity type silicon having <100> orientation and the source and drain are of a desired conductivity type.

In accordance with a still more particular aspect of the present invention, the ion implanted dopant is boron.

Utilizing the above-indicated method, an array of n-channel FETs surrounded by recessed oxide is provided wherein the doping concentration at the interface between the channel region and the recessed oxide is at least equal to or greater than the doping concentration in the channel region. Under such conditions, an array of minimum dimension n-channel FETs surrounded by fully recessed oxide is provided in which the subthreshold sidewall conduction between source and drain and the parasitic conduction between adjacent FETs, is substantially reduced.

It is therefore an object of the present invention to provide an n-channel FET surrounded by recessed oxide in which the subthreshold source to drain sidewall conduction is substantially reduced.

Another object is to provide a fabrication process which premits the ion implantation of the channel region adjacent to its interface with recessed oxide simultaneously with the ion implantation of a channel stopper beneath the recessed oxide.

Another object is to provide an array of high switching speed n-channel FET one-device memory cells of minimum dimensions which is high in density and low in power consumption.

The foregoing and other objects, features and advantages of the present invention will be apparent from the following more particular description of a preferred embodiment as illustrated in the accompanying drawings.

DETAILED DESCRIPTION OF THE INVENTION

Figure 1A:
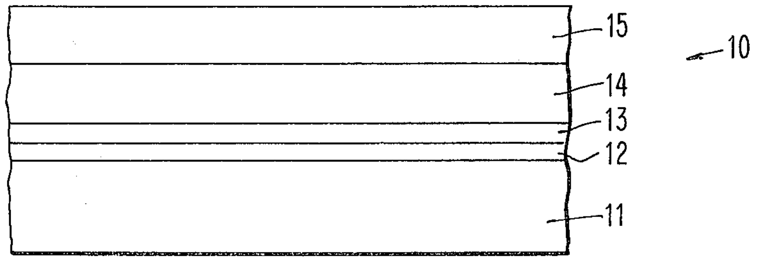
FIGS. 1A – 1E are views of a recessed oxided region in various stages of fabrication.

Referring to FIG. 1A, there is shown a fragment of the initial structure of the invention generally shown as 10. A p-type silicon substrate 11 having a <100> crystal orientation is prepared by slicing and polishing a p-type silicon boule grown in the presence of a p-type dopant such as boron following conventional crystal-growth techniques.

A thin surface protection layer of silicon dioxide 12 is grown on or deposited on the silicon substrate 11 to protect it from damage by a subsequent nitride layer. The silicon dioxide layer, which is approximately 50 to 300 angstrom units (A) thick, preferably 50 A, may be formed by thermal oxidation of the silicon surface at 1000°C in the presence of dry oxygen, or by chemical-vapor deposition of silicon dioxide.

An adherent oxidation barrier layer 13 of a material such as silicon nitride, AlN, BN, $Al_2O_3$, SiC or $Ti_2O_3$ is then deposited onto the silicon dioxide layer 12. Preferably the layer 13 is of silicon nitride and is approximately 500 to 2000 A thick, preferably 2000 A. The layer may be deposited by well known chemical-vapor deposition techniques. Layer 13 serves as an etching mask to delineate the thin layer of silicon dioxide 12, as an oxidation mask during subsequent growth of the recessed oxide and as a blocking mask for the boron implantation to follow.

A second layer of silicon dioxide 14 is then deposited. The silicon dioxide layer is approximately 1500 to 5000 A thick, preferably 1500 A, and may be formed by chemical-vapor deposition. Layer 14 serves both as a delineation mask for etching the nitride layer 13 and as a blocking mask for the ion implantation to follow.

In place of layer 14 there may be substituted a layer of a metal such as W, Mo and Cr. The metal film is etched using any well known etchant therefor.

It should be readily recognized that the oxidation barrier layer 13 and the ion implantation blocking layer 14 could be replaced by a single layer of a material such as Pt or Au which serves as both an oxidation barrier and an ion implantation blocking layer. A pattern determining layer such as a layer of resist material 15 of the type employed in known masking and etching techniques for forming openings in silicon oxide is placed over the surface of the ion implantation blocking layer 14. Any of the well-known photosensitive polymerizable resistants known in the art may be used. The resistant material is applied as by spinning on or by spraying.

The layer of photoresist material 15 is dried and then selectively exposed to ultraviolet radiation through a photolithographic mask, not shown. This mask is of a transparent material having opaque portions in a predetermined pattern.

The masked wafer is subjected to ultraviolet light, polymerizing the portions of the resist material underlying the transparent regions of the mask. After removing the mask, the wafer is rinsed in a suitable developing solution which washes away the portions of the resist material which were under the opaque regions of the mask and thus not exposed to the ultraviolet light. The assembly may then be baked to further polymerize and harden the remaining resist material 15 which conforms to the desired pattern, i.e., it covers the region in which the recessed oxide will not be grown.

Next the structure is treated to remove the portions of the silicon dioxide or metal layer 14 not protected by the resist material 15 where silicon dioxide is used. The wafer is immersed in a solution of buffered hydrofluoric acid for about 2 minutes. The etching solution dissolves silicon dioxide but does not attack silicon nitride or other materials of the assembly.

Figure 1B:
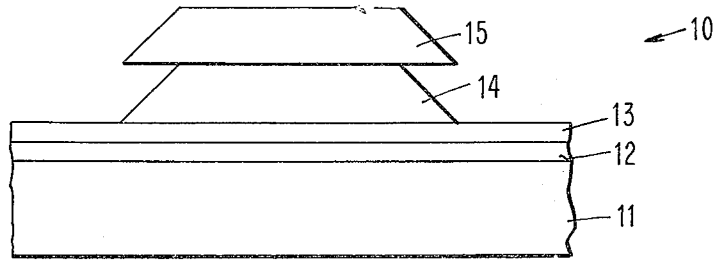

The photoresist material 15 atop the etched silicon dioxide 14 is then removed by dissolving in a suitable solvent. As can be seen in FIG. 1B, the remaining silicon dioxide conforms to a predetermined pattern. The silicon dioxide 14 now serves as a mask for etching predetermined patterns in the nitride layer 13, the thin oxide layer 12, and the silicon substrate 11. Patterns in the nitride layer 13 are formed by etching in a phosphoric acid solution for approximately 30 minutes at 180°C. Then, the patterns in the thin silicon dioxide layer 12 are formed by etching in a buffered hydrofluoric acid solution for about 15 seconds.

Figure 1C:
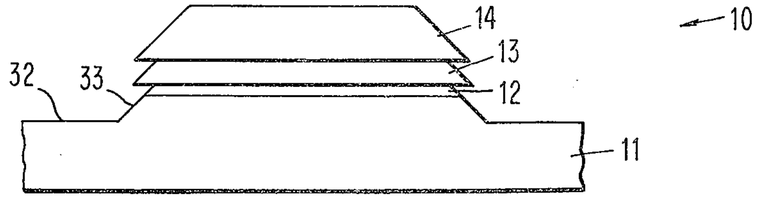

As shown in FIG. 1C, flat-bottomed holes 32 approximately 2000 A deep are then etched into the exposed silicon regions by immersing the assembly in a solution of a known anisotropic etchant such as potassium hydroxide, pyrocatechol, or hydrazine. Due to the nature of the reaction of the anisotropic etchant with the <100>-oriented silicon, the sidewalls 33 of the holes 32 in the silicon make an angle of 54.7° to the vertical as determined by the crystal-lographic planes of atoms in the silicon and do not undercut the nitride etching mask. This feature is important to the method of the invention as it is essential that some of the subsequently implanted boron ions be located in the silicon sidewall near the silicon surface. The depth and the surface smoothness at the bottom of the hole 32 can be well controlled by adjusting the composition and the temperature of the etchant. It should be noted that in order for the anisotropic etchant to be effective it is necessary that the ordinate or abscissa of an x–y integrated circuit array be oriented to within 5° of the (010) or (001) crystallographic directions of the <100>-oriented silicon substrate.

Figure 1D:
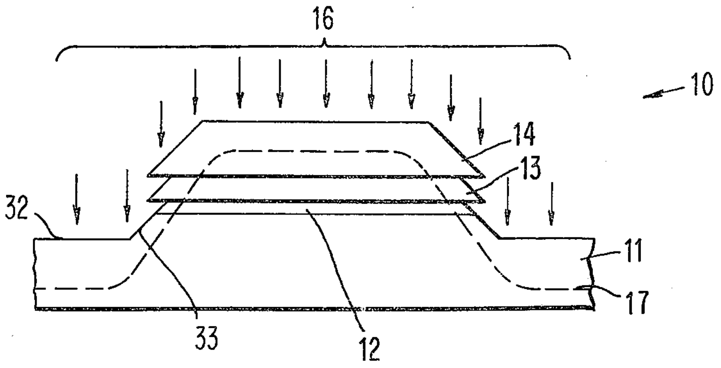

After etching the flat-bottomed hole 32 in the silicon substrate 11, the structure is then subjected to an implantation of p-type dopant ions such as B, Al, Ga or In, as illustrated by the arrows in FIG. 1D. Illustratively, the structure is implanted with a dosage of $B^{11}$ ions of approximately $5 \times 10^{12}$ atoms/cm$^2$ at an energy of approximately 65 KeV to a peak depth of about 2200 A beneath the exposed surface of the silicon. The dopant is implanted to a peak depth approximately equal to the thickness of the silicon consumed by the thermal oxidation and the dose is more than large enough to compensate for any subsequent loss of dopant by depletion. Now the thick oxide mask 14 and the nitride layer 13 together act as a blocking mask to prevent implanted boron ions from entering the region beneath the mask. Later, semiconductor devices will be fabricated into this protected region. Dashed line 17 illustrates the relative depth of ion penetration. After the implantation step, the oxide blocking mask 14 is etched away in a solution of buffered hydrofluoric acid.

The structure 10 is then subjected to a wet thermal oxidation for approximately 70 minutes at 10000°C in a steam ambient to form a recessed oxide region 18 of about 4500 A thick in substrate 11. The nitride layer 13 serves to prevent oxidation in the area thereunder. The thin oxide layer 12 is too thin to allow substantial lateral oxidation on the surface of substrate 11. During thermal oxidation, boron is depleted from substrate 11 as the oxide grows downward and sideways into substrate 11. The boron concentration implanted into the bottom of hole 32 and sidewalls 33 defining the hole etched previously into the silicon is, however, more than sufficient to compensate for the subsequent loss by depletion.

Figure 1E:
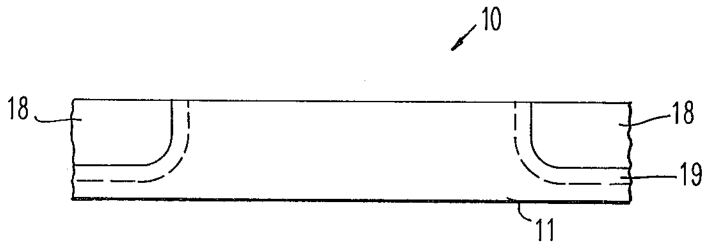

The nitride layer 13 and the thin oxide layer 12 are removed by again using the etchant solution described earlier. The completed recessed oxide regions 18 and the implanted boron layer 19 surrounding the recessed oxide are shown in FIG. 1E.

Figure 2:
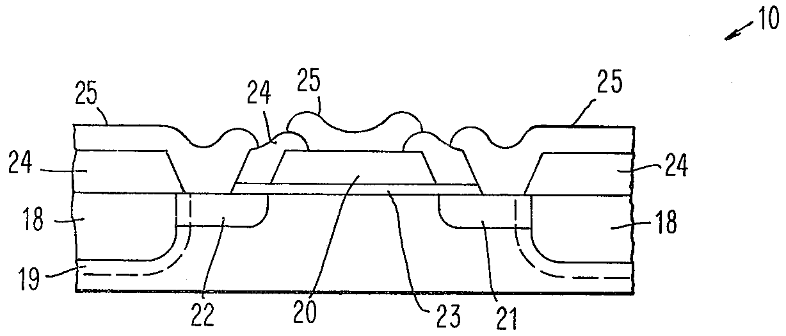
FIGS. 2 and 4 are side-elevational views of an n-channel field effect transistor fabricated by the method of this invention.

FIG. 2 shows a side-view of an n-channel field effect transistor (FET) fabricated using the fully recessed oxide isolation region to define the boundaries of the FET (i.e., the source, drain and channel regions all contact the recessed oxide boundary). Any one of the several conventional methods of fabricating the FET may be used, although we have chosen to illustrate an FET fabrication with a polysilicon gate 20 and an ion-implanted n-conductivity type source and drain regions 21 and 22 respectively. The fabrication of the FET is basically as follows. First, a gate oxide layer 23 of 350 to 500 angstrom units thickness is grown. Then, a polysilicon layer 20 of approximately 3500 angstrom units is deposited, doped n+, and the gates delineated by conventional photolithographic or other means. Then the n+ source and drain regions 21 and 22, 2000 A deep, are formed by an $As^{75}$ implant of approximately 100 KeV energy and $4 \times 10^{15}$ atoms/cm$^2$ dose. A final insulating oxide layer 24 of 2000 A thickness is deposited, via holes to allow contact to the source and drain regions 21 and 22 as well as to the polysilicon gate regions 20 are etched wherever required, and the contact metallization 25 is deposited and delineated. The intersection of the boron sidewall dopant with the n+ source or drain region does not seriously degrade the reverse bias breakdown voltage of these junctions.

Figure 3:
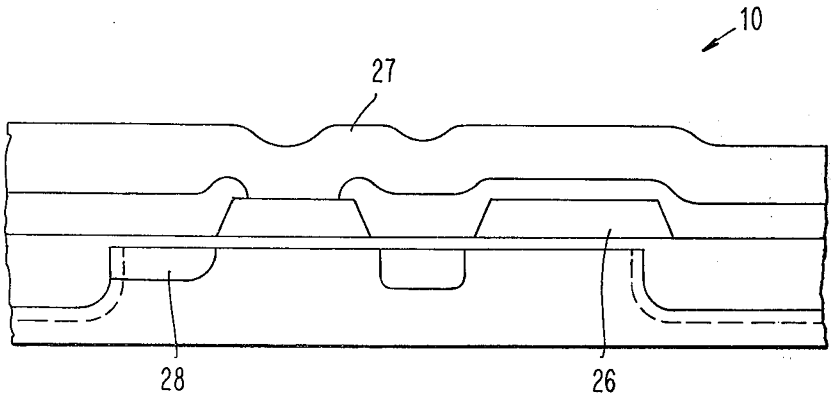
FIG. 3 shows side-elevational view of a dynamic one-device memory cell fabricated by the method of this invention.

FIG. 3 shows a side view of a dynamic one-device memory cell fabricated using the recessed oxide isolated FET method of the invention. The memory cell consists of an FET switching device as in FIG. 2 and a polysiliconsilicon dioxide-silicon storage capacitor 26. Information in the form of a surplus or deficiency of electrons can be placed onto or removed from the lower (silicon) plate of the storage capacitor by appropriately biasing the word line 27 which connects to the gate of the FET, and the bit line 28 which connects to the drain of the FET as described in U.S. Pat. No. 3,387,286 entitled Field-Effect Transistor Memory, issued June 4, 1968 to R. H. Dennard and assigned to the same assignee as the present application.

Figure 4:
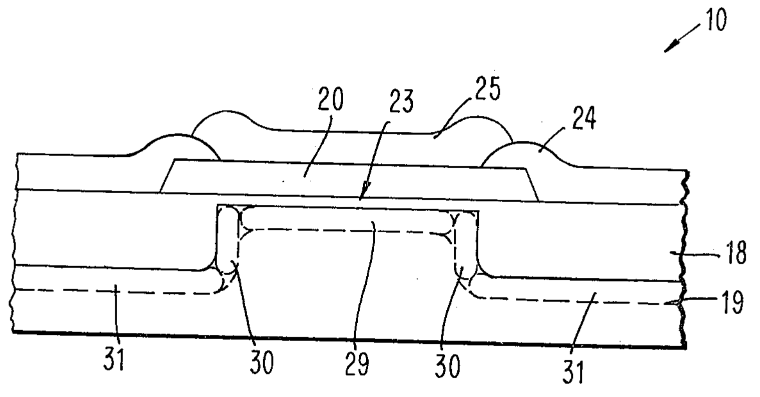

FIG. 4 shows a different side view of the FET previously illustrated in FIGS. 2 and 3. This view is taken perpendicular to the previous views shown in FIGS. 2 and 3 at a position midway between the source and drain regions (i.e., at the center of the channel of the FET). FIG. 4 shows the main conduction channel 29 of the FET. The boron implanted sidewall channel region 30, and the implanted boron parasitic-channel stopper region 31 comprise the total boron implanted layer 19.

Figure 5:
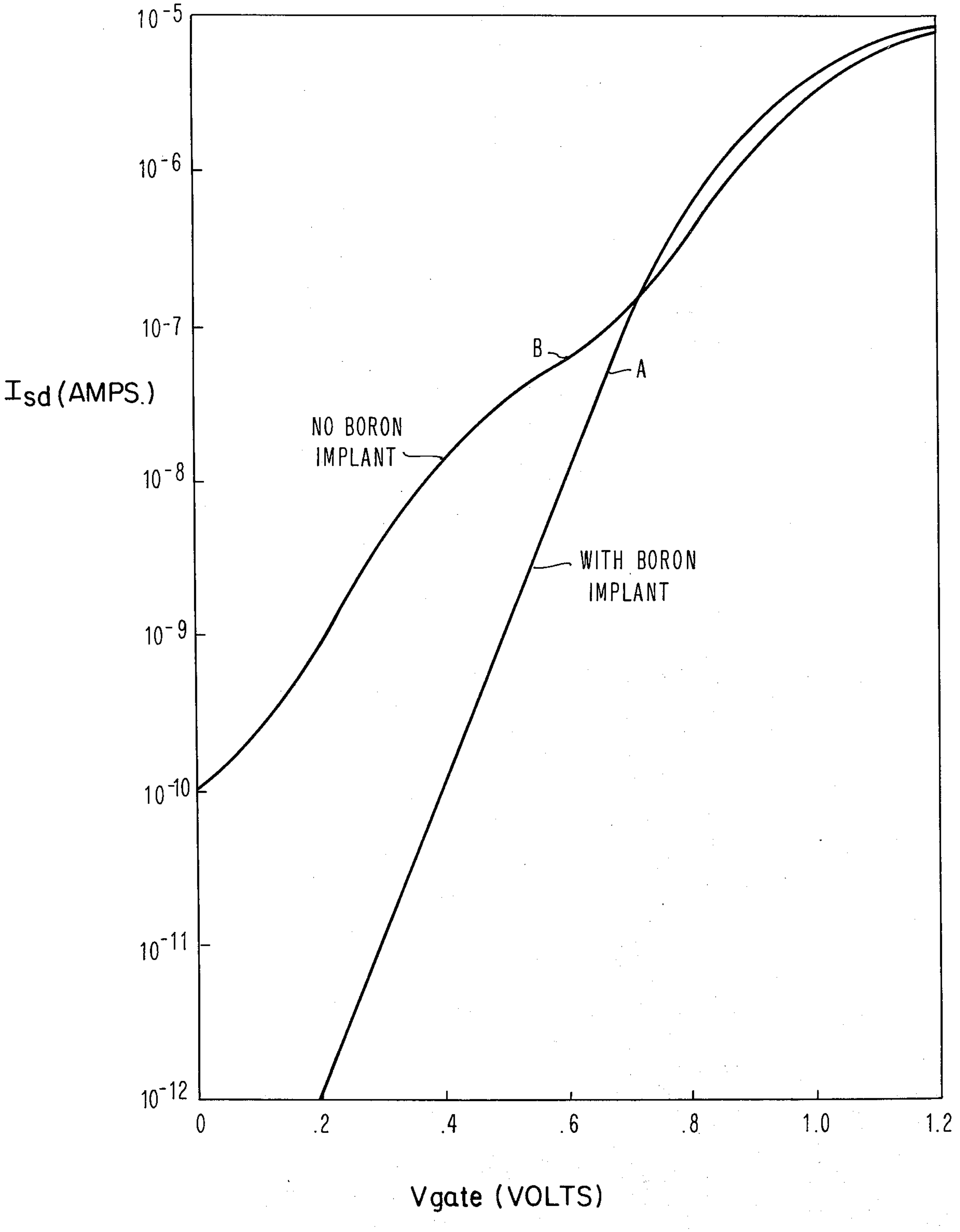
FIG. 5 is the subthreshold turn-on characteristic for an n-channel field effect transistor fabricated by the method of this invention.

FIG. 5 shows the experimental source-to-drain subthreshold conduction characteristic taken from an FET fabricated with recessed oxide isolation for use in a dynamic one-device memory cell like that shown in FIG. 2. Characteristic A of FIG. 5 is typical of a structure fabricated following the boron implantation method of this patent, while characteristic B is for a similar structure which lacks the implanted boron sidewall doping (30 in FIG. 4). Because of the deficiency of boron in the silicon sidewall, a parallel conducting channel with a relatively lower gate threshold voltage is formed in parallel with the main channel of the FET as illustrated by characteristic 13. This parallel sidewall channel is responsible for a high level of source-to-drain conduction even with zero applied gate voltage. The different between characteristics A and B is the detrimental sidewall conduction current. Without the sidewall doping, information in the form of electronic charge stored in the capacitor of the one-device cell will leak out along the sidewall channel of the FET. In order for the capacitor of the one-device cell to have a usefully long storage time for integrated circuit applications, an FET conduction characteristic such as that shown by curve A is required.

Figure 6:
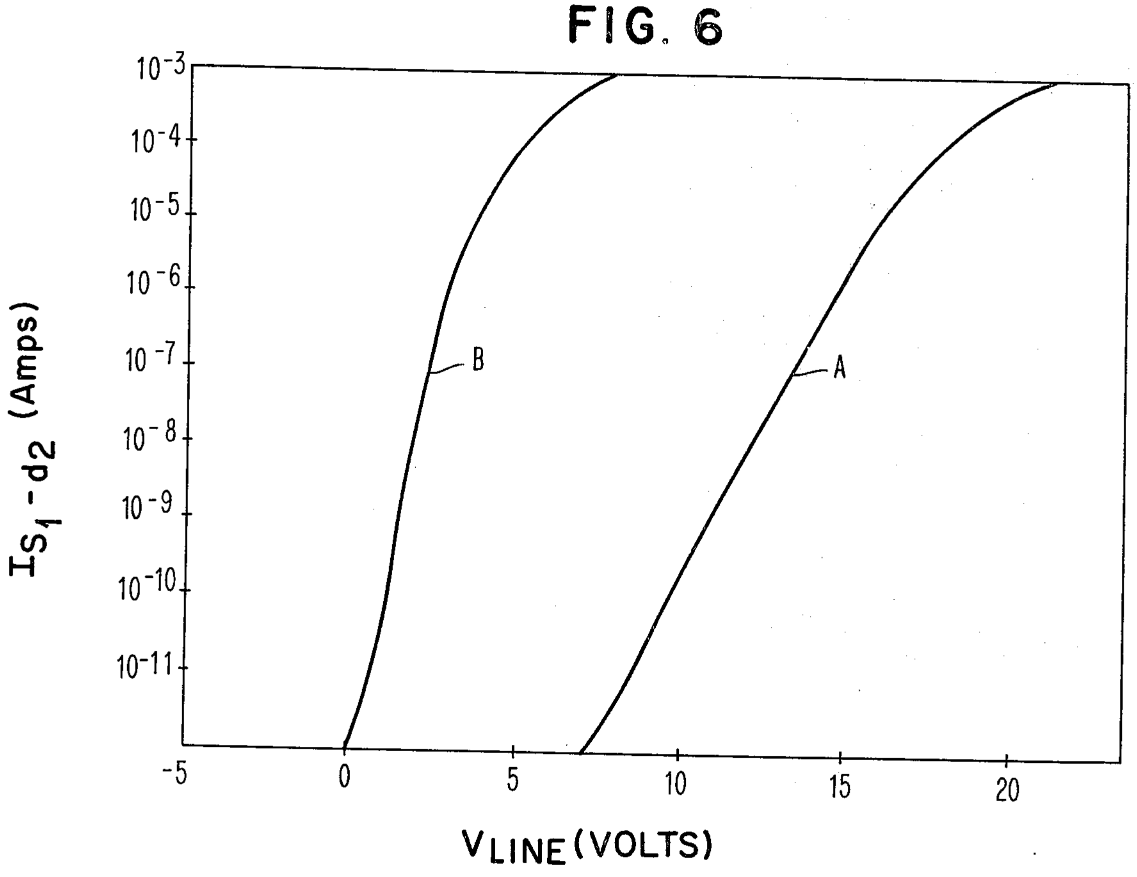
FIG. 6 shows the leakage current under the recessed oxide region fabricated by the method of this invention.

FIG. 6 confirms that the implanted boron layer under the recessed oxide also functions as a parasiticchannel stoppper (31 in FIG. 4). The experimental characteristics of FIG. 6 show the conduction between the source of one FET and the drain of an adjacent FET separated one from the other by a recessed oxide region. A metal interconnection line crossing over the separating recessed oxide region can act as the gate of a parasitic FET with the recessed oxide serving as the gate insulator of the FET. Characteristic A in FIG. 6 shows the parasitic device to device conduction current when the recessed oxide has an implanted boron layer under it, while characteristic B is for a similar structure without the implanted boron layer. When the boron layer is absent, even a small voltage on the metal interconnection line is sufficient to cause conduction between adjacent FETs. In a one-device cell memory array, this would lead to detrimental power losses and information cross-talk between adjacent bit lines and storage capacitors.

As shown and described for illustrative purposes, the devices fabricated in accordance with the method of the invention are n-channel enhancement-mode FETs having fully recessed oxide isolation regions. The n-channel FET has the advantage of exhibiting faster switching speeds than does the p-channel FET of the prior art. The method of the invention provides a means for surrounding the fully recessed oxide region with a layer of implanted boron ions. This boron layer has two functions: first, it serves as a parasitic-channel stopper under the recessed oxide; and, second, it serves to reduce sidewall conduction current ot a level lower than that of the main channel of the FET. The above features may be advantageously employed in fabricating high density integrated circuit arrays of dynamic FET one-device memory cells.

While there has been shown and described a preferred embodiment of the present invention, it will be obvious to those skilled in the art that various changes and modifications may be made therein without departing from the invention as defined by the appended claims.

What is claimed is:

1. A method for fabricating silicon semiconductor devices having reduced subthreshold sidewall conduction between source and drain regions of a field effect transistor surrounded by recessed oxide, including the steps of:

1. providing a substrate having successively deposited thereon a surface portecting layer, an oxidation barrier layer, an ion-implantation blocking layer, and a pattern defining layer;
2. exposing and developing said pattern defining layer to provide a predetermined pattern on said ion-implantation blocking layer;
3. etching said ion-implantation blocking layer according to said predetermined pattern;
4. successively etching said oxide barrier and surface protecting layers in the areas defined by said etched ion-implantation blocking layer;
5. etching said substrate in the exposed areas defined by the oxidation barrier and surface protecting layers with an anisotropic etchant to obtain canted sidewalls in said substrate and which do not appreciably undercut said above layers;
6. ion-implanting said substrate with a p-type dopant beneath the etched out areas and along the canted sidewalls thereof;
7. removing said ion-implantation blocking layer by treating the same with a suitable etchant therefor;
8. subjecting said substrate to thermal oxidation in the areas not protected by said oxidation barrier layer to provide fully recessed oxide areas therein;
9. successively removing said oxidation barrier and surface protecting layers with suitable etchants and thereafter;
10. conventionally fabricating field effect transistors in said above treated substrate.

2. A method according to claim 1 wherein said substrate has a p-type conductivity.

3. A method according to claim 1 wherein said dopant is implanted to a peak depth approximately equal to the thickness of the silicon consumed by said thermal oxidation and with a dosage that more than compensates for any subsequent dopant loss by depletion.

4. A method as in claim 3 wherein said etched out area and the canted sidewalls thereof are ion-implanted with $B^{11}$ atoms having a dosage of about $5 \times 10^{12}$ atoms/$cm^2$ and an energy of about 65 KeV.

5. A method as in claim 3 wherein said $B^{11}$ ions are implanted in said substrate to a peak depth of about 2200 angstrom units.

6. A method as in claim 1 wherein said ion-implantation blocking layer is replaced by a metal selected from the group consisting of W, Mo and Cr.

* * * * *